(12) United States Patent
Churchill et al.

(10) Patent No.: US 7,898,157 B2
(45) Date of Patent: Mar. 1, 2011

(54) PIEZOELECTRIC COMPOSITE BEAM WITH AUTOMATICALLY ADJUSTABLE NATURAL FREQUENCY

(75) Inventors: David L. Churchill, Burlington, VT (US); Steven W. Arms, Williston, VT (US)

(73) Assignee: Microstrain, Inc., Williston, VT (US)

( * ) Notice: Subject to any disclaimer, the term of this patent is extended or adjusted under 35 U.S.C. 154(b) by 0 days.

(21) Appl. No.: 12/708,518

(22) Filed: Feb. 18, 2010

(65) Prior Publication Data
US 2010/0141096 A1 Jun. 10, 2010

Related U.S. Application Data

(62) Division of application No. 11/604,117, filed on Nov. 24, 2006, now Pat. No. 7,692,365.

(60) Provisional application No. 60/739,976, filed on Nov. 23, 2005, provisional application No. 60/753,679, filed on Dec. 22, 2005.

(51) Int. Cl.
*H01L 41/08* (2006.01)
*H01L 41/107* (2006.01)
*H02N 2/18* (2006.01)

(52) U.S. Cl. .................. 310/339; 310/330; 310/331

(58) Field of Classification Search .......... 310/329–331, 310/339
See application file for complete search history.

(56) References Cited

U.S. PATENT DOCUMENTS

| | | | | |
|---|---|---|---|---|
| 4,494,409 | A * | 1/1985 | Kondo et al. | 73/651 |
| 5,912,524 | A * | 6/1999 | Ohnishi et al. | 310/321 |
| 6,078,126 | A * | 6/2000 | Rollins et al. | 310/330 |
| 7,408,289 | B2 * | 8/2008 | Lee | 310/323.02 |
| 2003/0214200 | A1* | 11/2003 | Thompson et al. | 310/329 |
| 2005/0253486 | A1* | 11/2005 | Schmidt | 310/329 |
| 2008/0136292 | A1* | 6/2008 | Thiesen | 310/334 |
| 2009/0284102 | A1* | 11/2009 | Karakaya et al. | 310/321 |

* cited by examiner

*Primary Examiner* — J. SanMartin
(74) *Attorney, Agent, or Firm* — James Marc Leas

(57) ABSTRACT

An energy harvesting system includes a composite structure that has a first spring, a piezoelectric structure, and a proof mass. The piezoelectric structure and the proof mass are mounted on the first spring. The composite structure has a natural frequency of vibration. The natural frequency of vibration of the composite structure is automatically adjustable.

46 Claims, 18 Drawing Sheets

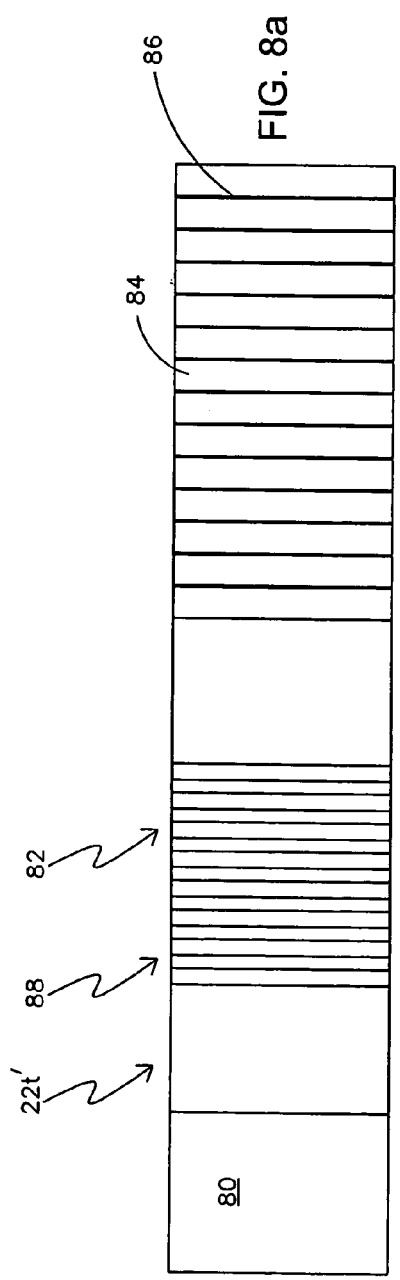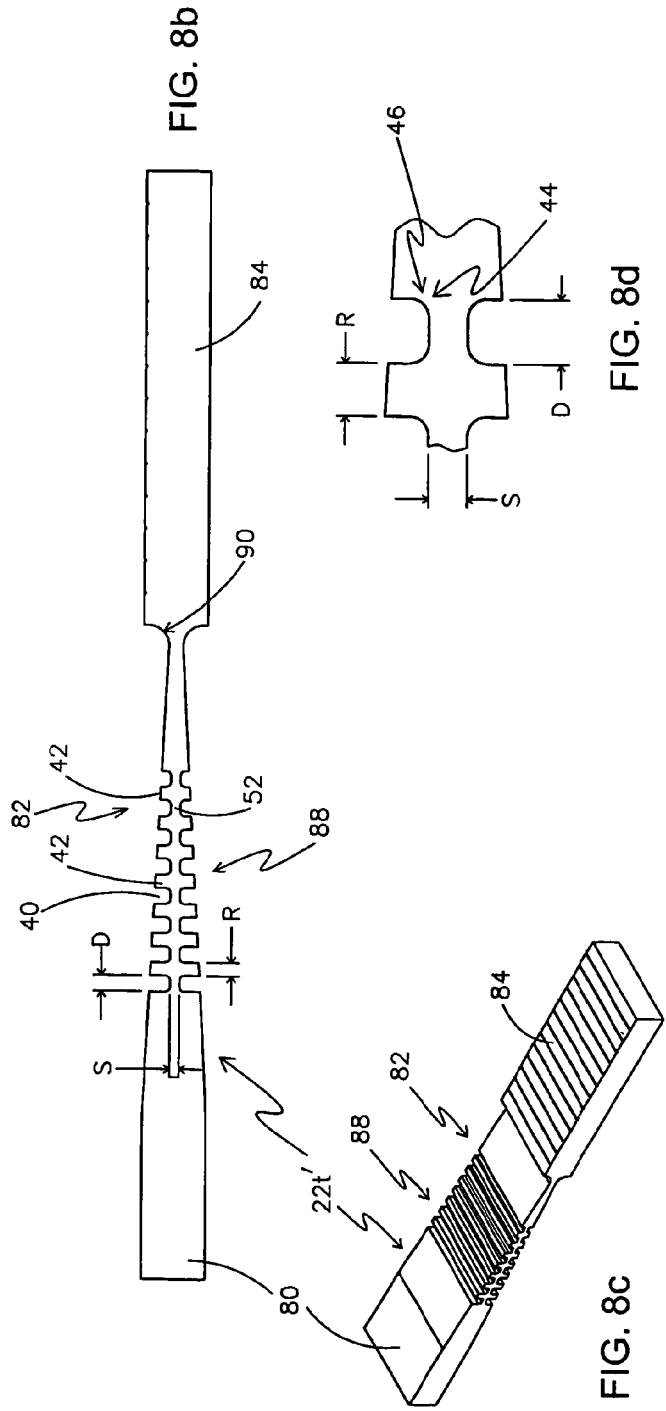

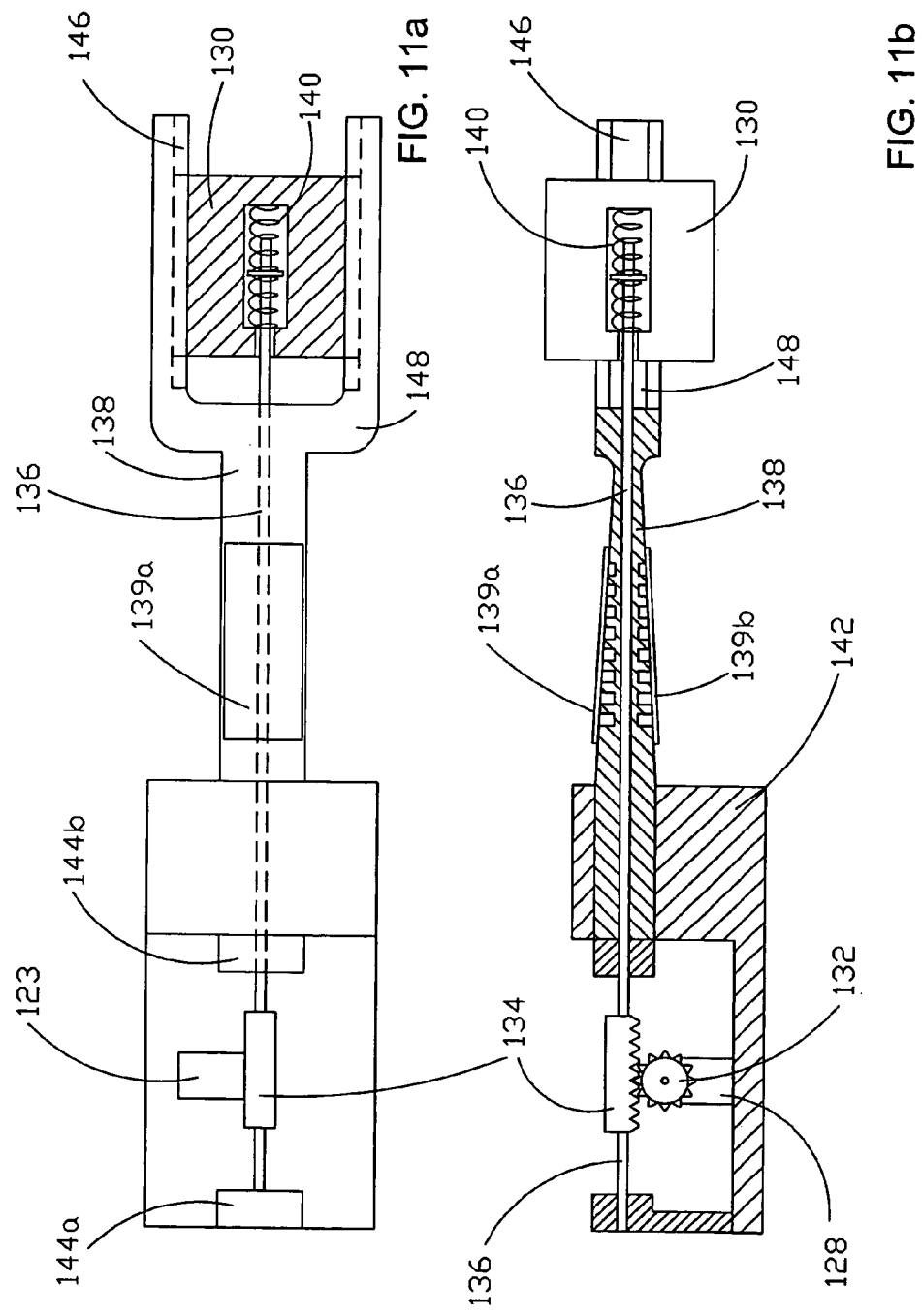

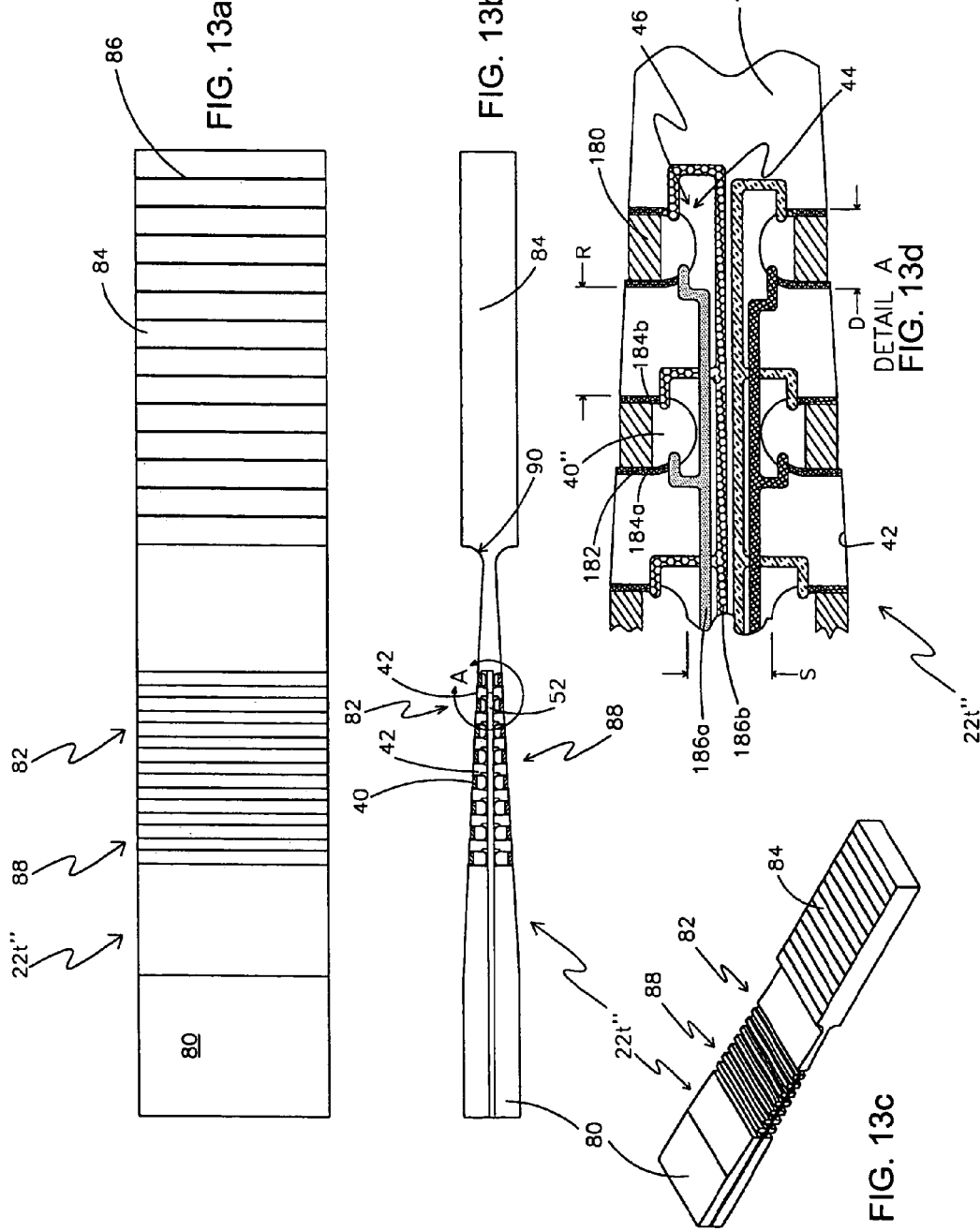

US 7,898,157 B2

PIEZOELECTRIC COMPOSITE BEAM WITH AUTOMATICALLY ADJUSTABLE NATURAL FREQUENCY

RELATED APPLICATIONS

This application is a divisional of U.S. patent application Ser. No. 11/604,117, filed Nov. 24, 2006 now U.S. Pat. No. 7,692,365, which claims the benefit of provisional patent application 60/739,976, filed Nov. 23, 2005, both of which are incorporated herein by reference.

This application also incorporates by reference the material in provisional patent application 60/753,679, filed Dec. 22, 2005.

FIELD

This patent application generally relates to energy harvesting. More particularly, it relates to a system for obtaining energy from an ambient vibrating source. Even more particularly, it relates to an improved cantilever beam spring for harvesting energy with piezoelectric elements.

BACKGROUND

Harvesting energy from a vibrating structure, such as a vehicle, has involved mounting piezoelectric (PZT) elements along with a proof mass to provide a vibrating beam. Previous investigators found advantage in providing PZT elements so strain is uniform across the area of each PZT element as the cantilever beam spring vibrates. If some areas generate more current than other areas the current from one area is shunted to the other area and some of the power is dissipated. Thus, investigators have looked for schemes that provide uniform strain with a high value.

It is well known that rectangular cantilever beam springs have more strain at the end near the base and less strain near the proof mass. It is possible to provide more uniform strain in bending by tapering the beam in width or in thickness, as shown in Marks' *Standard Handbook for Mechanical Engineers*, Eighth Edition, McGraw Hill, 1978, pages. Various tapers are shown including a parabolic curvature, as shown in FIG. 1, and a linear taper.

A book, *Energy Scavenging for Wireless Sensor Networks*, by Roundy, et al., Kluwer Academic Publishers, 2004, suggested "varying the width of the beam such that the strain along the length of the beam is the same as the strain at the fixed end, resulting in a larger average strain" to improve power obtained from a piezoelectric mounted on the beam.

However, the amount of power output by such a varying width scheme has still not been particularly high. Thus a better scheme is needed to provide more power output from a vibrating beam, and these improvements are provided in this patent application.

SUMMARY

One aspect of the present patent application is an energy harvesting device comprising a composite structure including a base spring, a piezoelectric structure, and a proof mass. The composite structure has a natural frequency of vibration. The natural frequency of vibration of the composite structure is automatically adjustable.

Another aspect of the present patent application is an energy harvesting system comprising substrate, a composite structure, and a controller. The composite structure includes a first spring, a piezoelectric structure, and a mass. The first spring has a first spring surface having elevated portions separated by a recessed portion. The piezoelectric structure substantially crosses the recessed portion. The mass is mounted on the first spring. The composite structure has a composite structure natural frequency of vibration. The composite structure is mounted on the substrate. The substrate is subject to vibration at a substrate frequency, wherein the substrate frequency is variable. The composite structure natural frequency is adjustable to match the substrate frequency. A feedback signal from the piezoelectric element is used by the controller to automatically adjust the composite structure natural frequency to match the substrate frequency.

BRIEF DESCRIPTION OF THE DRAWINGS

The foregoing will be apparent from the following detailed description, as illustrated in the accompanying drawings, in which:

FIG. 8a is a top view of a slotted tapered cantilever beam spring of the present patent application;

FIG. 8b is a side view of the slotted tapered cantilever beam spring of FIG. 8a;

FIG. 8c is a three dimensional view of the slotted tapered cantilever beam spring of FIG. 8a;

FIG. 8d is an enlarged side view of one of the slots in the slotted tapered cantilever beam spring of FIG. 8a;

FIGS. 11a and 11b are a cross sectional views of a tapered embodiment of a cantilever beam spring of the present patent application in which slots are provided in the beam spring and piezoelectric elements are bonded to remaining surfaces on either side of the slots and in which the location of the proof mass can be tuned with a motor;

FIG. 13a is a top view of a slotted tapered cantilever beam spring of another embodiment of the present patent application having a bulk PZT element in each slot;

FIG. 13b is a side view of the slotted tapered cantilever beam spring of FIG. 13a showing a bulk PZT element in each slot;

FIG. 13c is a three dimensional view of the slotted tapered cantilever beam spring of FIG. 13a;

FIG. 13d is an enlarged side view of two of the slots in the slotted tapered cantilever beam spring of FIG. 13a with a bulk PZT element in each slot;

FIG. 14d is a cross sectional view of a beam with stacked PZT elements arranged in series with each other and with a diode rectification bridge as shown in FIG. 14a.

DETAILED DESCRIPTION

The present patent application provides an improved cantilever beam spring that substantially increases the power output beyond that available from a standard cantilever beam spring with varying width, as described in the book by Roundy. The present application also provides improved tuning to more nearly match the natural frequency of vibration of the cantilever beam spring to the vibration frequency of the structure to which it is mounted to more efficiently harvest energy from that vibration.

Figure 1:
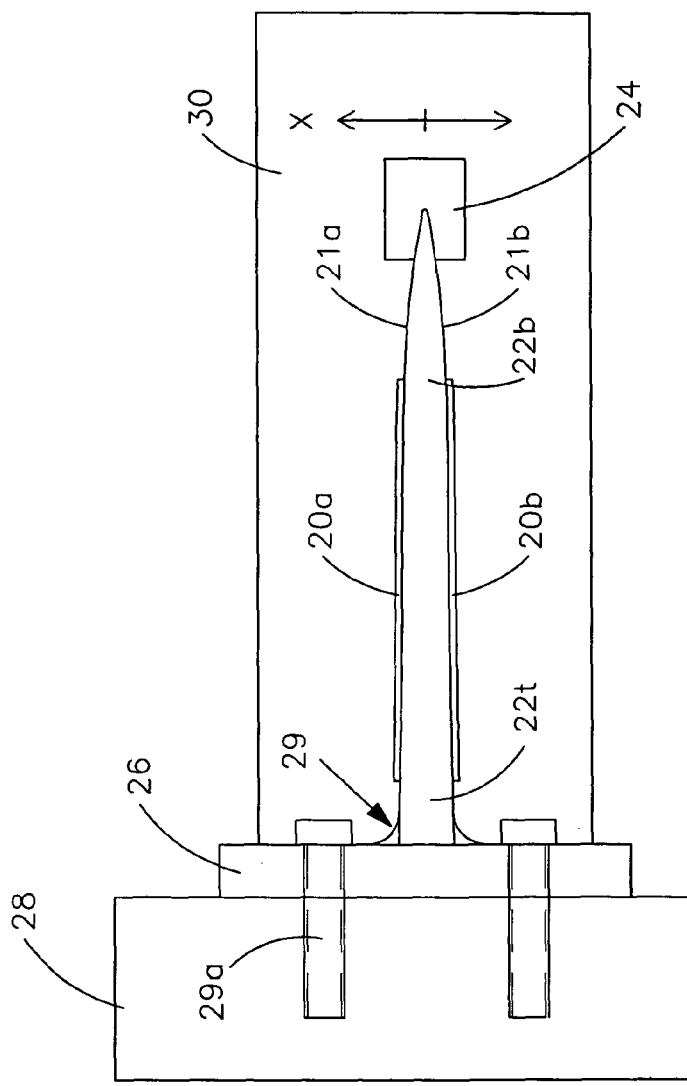
FIG. 1 is a cross sectional view of a tapered cantilever beam spring mounted to a structure, the beam spring having a proof mass and bonded piezoelectric elements.

Harvesting energy from a vibrating structure can be accomplished by bonding piezoelectric (PZT) elements 20a, 20b on surfaces 21a, 21b of tapered cantilever beam spring 22t and mounting proof mass 24, as shown in FIG. 1. Cantilever beam spring 22t is connected to base 26 that is attached to vibrating structure 28 with threaded bolts 29a. Cantilever beam spring 22t and base 26 can be fabricated in one unitary structure, and fillets 29b can be provided there between. If cantilever beam spring 22t vibrates in the plane of the paper the strain is highest at its top and bottom surfaces. Cantilever beam spring 22t vibrates because of its contact with vibrating structure 28. PZT elements 20a, 20b move with surfaces 21a, 21b of cantilever beam spring 22t. PZT elements 20a, 20b are alternately strained in tensile and compressive strains, and they generate an alternating current that depends on the magnitude of strain rate they experience. This alternating current can then be immediately used or it can be stored, for example in a rechargeable battery. The entire device may be protected in enclosure 30.

Figure 2:
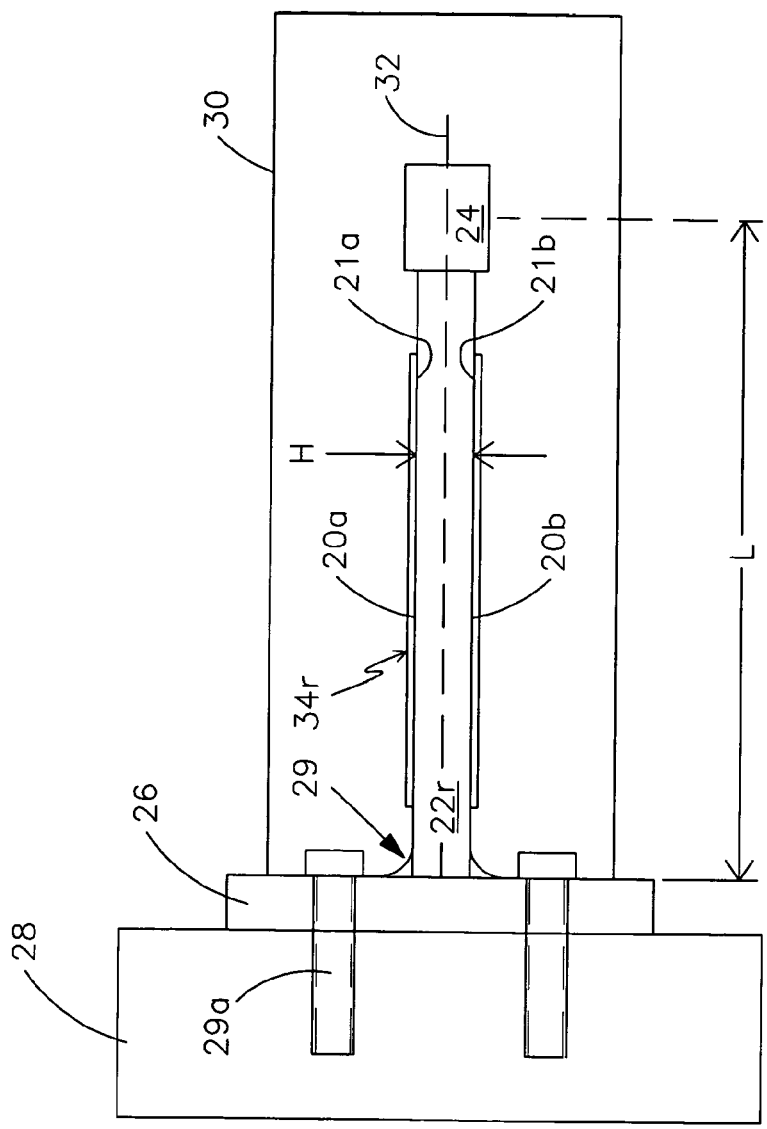
FIG. 2 is a cross sectional view of a cantilever beam spring similar to the beam spring of FIG. 1 but with a rectangular cross section.

Because the ideas of the present patent application apply regardless of taper, and because taper adds complexity to the description of these ideas, in the calculations below we will include a thick beam without taper and provide results for beam 22r with rectangular cross section, as shown in FIG. 2. Providing taper improves upon these results but the general principles obtained still apply.

As described above, the amount of electricity generated by PZT elements 20a, 20b increases with the strain they experience. The amount of strain that is generated at each surface 21a, 21b of beam 22r to which PZT elements 20a, 20b are bonded and on which they ride, depends on the width W (the dimension in FIG. 2 into the paper) and the thickness H of beam 22r and on the lateral displacement x of beam 22r from its neutral position along axis 32.

Figure 3:
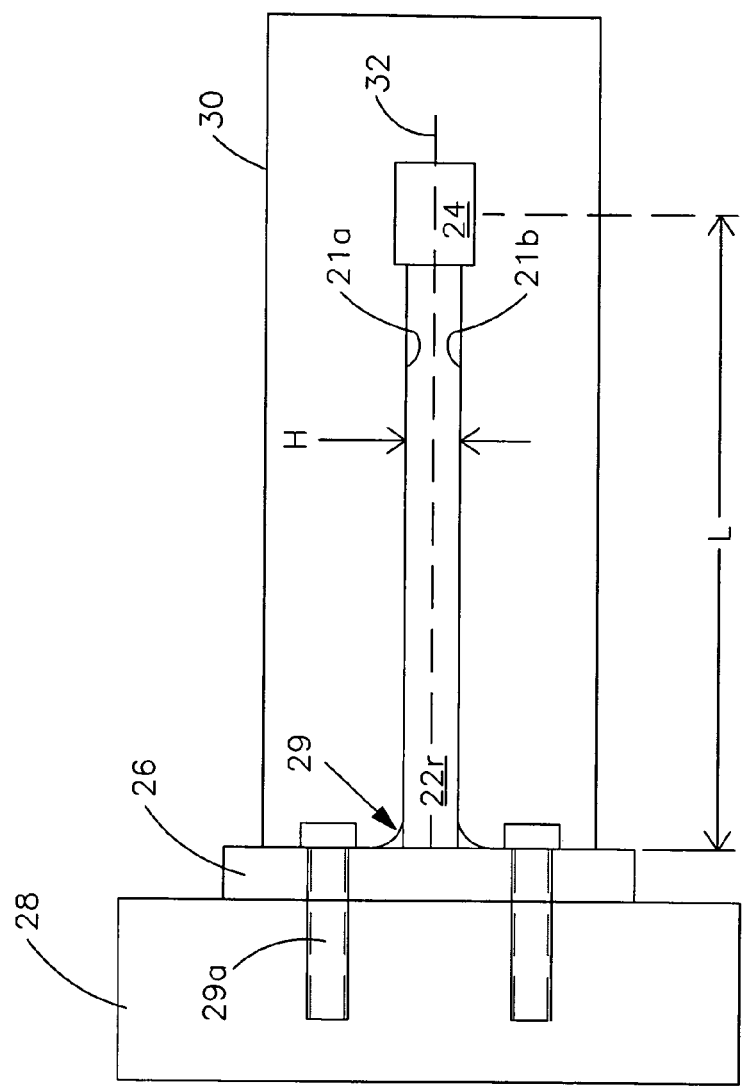
FIG. 3 is a cross sectional view of the cantilever beam spring of FIG. 2 but with the piezoelectric elements removed.

First, considering beam 22r by itself, without PZT elements 20a, 20b, as shown in FIG. 3, when beam 22r is deflected a fixed amount, x, the elastic energy U provided to beam 22r, is given by $$U = \frac{1}{2}Kx^2$$

where K, the spring constant of beam 22r, is a measure of the stiffness of beam 22r. K depends on material properties E of beam 22r, such as Young's modulus, and geometrical factors of beam 22r, including length L and moment of inertia I.

$$K = \frac{EI}{L}$$

Moment of inertia I depends linearly on width W and as the third power of thickness H of beam 22r $$I = \frac{1}{12}WH^3$$

Thus, choosing rectangular beam 22r with a larger thickness H increases moment of inertia I and stiffness K as the third power of thickness H. For a given lateral displacement x, the energy U of vibrating beam 22r thus also increases as the third power of the thickness H of beam 22r.

However, as rectangular beam thickness H increases it also becomes that much harder to provide the same lateral displacement x as compared to providing that displacement to a thinner beam. Put another way, for a given energy provided to beam 22r, the amplitude of vibration decreases as stiffness and spring constant K increase. Considering the equations above one can see that for a given energy of vibration the amplitude of vibration decreases as thickness increases as $1/H^{3/2}$.

PZT elements 20a, 20b bonded to top and bottom surfaces 21a, 21b of composite beam 34r ride along with those surfaces as beam 22r vibrates. PZT elements 20a, 20b acquire part of their energy of vibration as strain is repeatedly introduced in them 20b during the vibration of beam 22r. The strain PZT elements 20a, 20b experience depends on the amplitude of vibration of beam 22r so a larger amplitude of vibration would therefore transfer more of the energy of beam 22r to PZT elements 20a, 20b. Since for a given energy of vibration of beam 22r, the amplitude of vibration decreases as thickness H increases, a thinner beam appears to be desirable for obtaining the higher amplitude and imparting the greatest strain to PZT elements 20a, 20b. However, for a given amplitude of vibration, the energy of vibration of beam 22r increases as the cube of beam thickness W. With more energy of vibration beam 22r has more to transfer to PZT elements 20a, 20b. Thus, a beam with high thickness H and vibrating with high amplitude would be desirable.

The present inventors realized that if they could find a way to make the separation of PZT elements 20a, 20b large while making the effective thickness of beam 22r on which they are mounted smaller they could provide a larger amplitude of vibration to composite beam 34r, a larger strain in PZT elements 20a, 20b, and a larger transfer of energy from beam 22r to PZT elements 20a, 20b. Thus, the present applicants considered how to both provide increasing thickness to beam 22r to maintain wide separation between PZT elements 20a, 20b mounted on beam 22r to take advantage of the power of 3 increase in PZT element stiffness and energy harvested from PZT elements 20a, 20b, while at the same time reducing effective thickness and stiffness of beam 22r so it will vibrate with a larger amplitude and provide more strain to PZT elements 20a, 20b.

Figure 4:
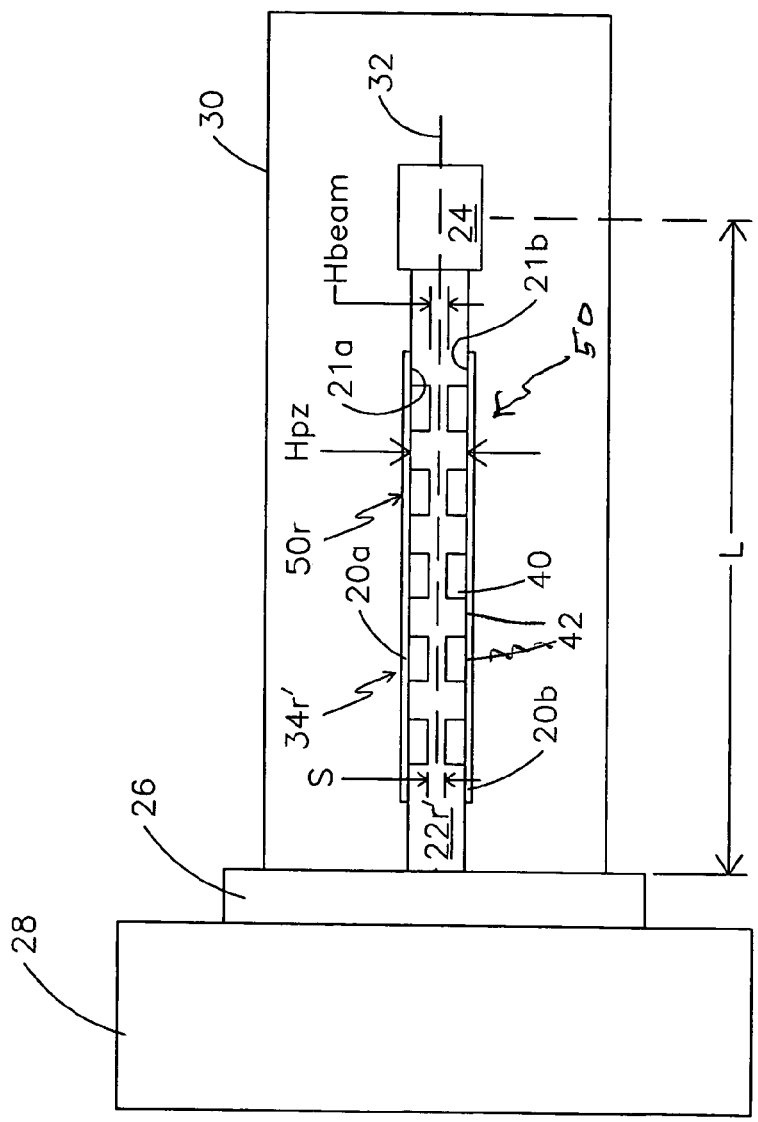
FIG. 4 is a cross sectional view of one embodiment of a cantilever beam spring of the present patent application in which slots are provided in the beam spring having a proof mass, and piezoelectric elements are bonded to remaining surfaces on either side of the slots.

One embodiment provides recessed portions, such as slots 40 in beam 22r', as shown in FIG. 4. Slots 40 include recessed portions and elevated portions. With slots 40 the present inventors found experimentally that they could reduce stiffness and effective thickness $H_{beam}$ of beam 22 while maintaining separation distance $H_{PZ}$ of PZT elements 20a, 20b.

Slots 40 in beam 22r' made beam 22r' flex as if it was much thinner and much more flexible than outside dimensions $H_{PZ}$ of adjacent elevated portions, such as ridges 42. PZT elements 20a, 20b mounted on ridges 42 thus remained widely separated, as shown in FIG. 4. With slotted beam 22r' acting mechanically as if it were a thinner beam having an effective thickness $H_{beam}$ intermediate between height and slot separation distance S, and with PZT elements 20a, 20b retaining their wide spacing because of the constraints provided by bonding to ridges 42, much more of the energy of vibration goes into PZT elements 20a, 20b and much less goes into slotted beam 22r', increasing the energy harvested from vibrating beam 22r'.

Slots 40 in beam 22 were machined with fillets 44 in corners 46 to reduce the chance of beam 22 cracking PZT elements were bonded to ridges 42 with Loctite Hysol E120HP epoxy 48. Epoxy 48 was deposited on both PZT elements 20a, 20b and on ridges 42 of beam 22 so as to whet both surfaces before bonding. PZT elements 20a, 20b were then mounted to ridges 42 of beam 22. A flat piece of rubber and a flat sheet of aluminum (not shown) were then placed on both PZT elements 20a, 20b and a C clamp used to clamp them solidly in place during curing. Excess epoxy that may have flowed into the slots was removed by flossing each slot with a wire before epoxy 48 had a chance to set.

Composite beam 34r' can be considered to include two separate vibrating springs, slotted beam 22r' and PZT spring 50r which is formed of PZT elements 20a, 20b, and these two vibrating springs vibrate in parallel with each other. PZT elements 20a, 20b act together as single spring 50 because each PZT element 20a, 20b provides a restoring force to the bending of the other PZT element 20a, 20b. While beam 22' bends in one direction during its vibration, one of PZT elements 20a, 20b is subjected to tensile stress while the other is subjected to compressive stress, and then these roles reverse as beam 22' bends the other way during its back and forth vibration.

For PZT spring 50r formed of PZT elements 20a, 20b, third power of separation distance between pair of PZT elements 20a, 20b is most determinative of moment of inertia, stiffness and energy of vibration, just as effective thickness $H_{beam}$ of beam 22r' is most determinative of these parameters for beam 22r'.

The energy of vibration U imparted to composite beam 34', including beam 22r' and PZT spring 50r, is shared among them as follows:

$$U = U_{beam} + U_{PZ}$$

where $U_{beam}$ is the energy of beam 22r' and $U_{PZ}$ is the energy in PZT spring 50r that includes both PZT elements 20a, 20b acting as a single spring element, each providing a restoring force against the bending of the other.

This equation can be rewritten as $$U = \frac{1}{2}K_{beam}x^2 + \frac{1}{2}K_{PZ}x^2$$

where $K_{beam}$ is the spring constant of beam 22r' and $K_{PZ}$ is the spring constant of PZT spring 50r, which is both PZT elements 20a, 20b acting together as a single spring. Substituting for K, and recognizing that by providing slots in beam 22r' we can provide different effective thicknesses for beam 22' and for PZT spring 50r, we get $$U = \frac{E_{beam}W_{beam}H_{beam}^3 x^2}{24L} + \frac{E_{PZ}W_{PZ}H_{PZ}^3 x^2}{24L}$$

where $W_{beam}$ is the width of slotted beam 22r', $H_{beam}$ is the effective thickness of slotted beam 22r', $W_{PZ}$ is the width of PZT elements 20a, 20b, and $H_{PZ}$ is the separation distance between PZT elements 20a, 20b of PZT spring 50r.

Now if a total energy U is transferred to slotted vibrating beam 22r' with PZT elements 20a, 20b bonded to its top and bottom surfaces, and if $H_{PZ}$ is substantially larger than the effective $H_{beam}$ of slotted beam 22r', then much more of that total energy U goes into vibration of PZT spring 50r and less goes into vibration of beam 22r', and we can expect to increase energy harvesting from PZT elements 20a, 20b.

Figure 5:
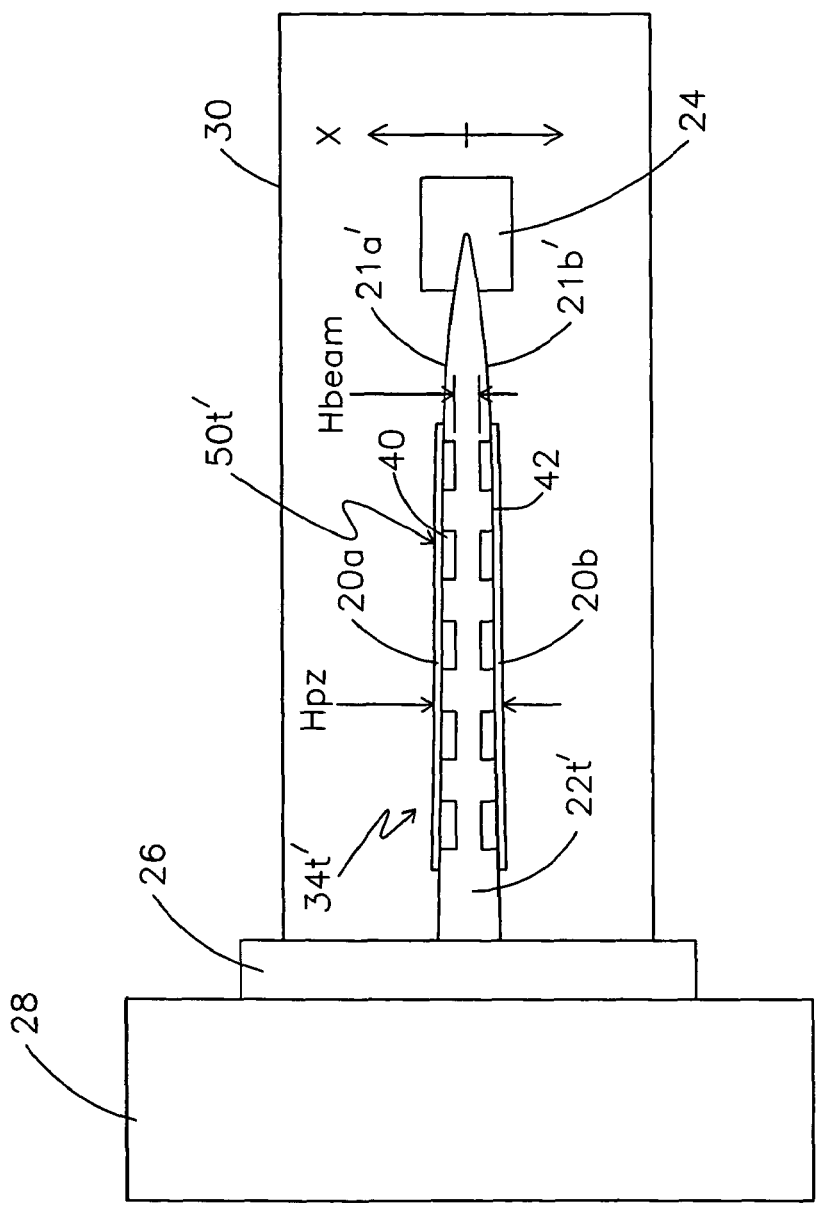
FIG. 5 is a cross sectional view of an embodiment of a cantilever beam spring of the present patent application in which slots are provided in a tapered beam spring having a proof mass, and piezoelectric elements are bonded to remaining surfaces on either side of the slots.

The present inventors found they could provide taper, provide a large separation distance of PZT elements 20a, 20b, and retain the same low loss to friction of the aluminum material of beam 22t, while reducing the effective thickness and providing more flexibility to beam spring 22t by providing slots 40 to composite cantilever beam spring 34t' composed of slotted tapered beam 22t' and PZT elements 20a, 20b bonded thereon that form PZT spring 50t', as shown in FIG. 5.

When they created tapered composite cantilever beam spring 34t' with slotted tapered beam 22t' and with PZT elements 20a, 20b bonded to ridges 42 and spanning across slots 40 they found that they still developed a relatively stiff composite structure, but now the majority of the resistance to bending was provided by PZT spring 50t' rather than by slotted beam 22t' on which PZT elements 20a, 20b were mounted. The present inventors found that this configuration reduced the moment of inertia of beam 22t' compared to that of tapered beam 22 of FIG. 1 and compared to the moment of inertia of PZT spring 50t'.

Under comparable vibration conditions, tapered composite cantilever beam spring 34t' also develops a lot more strain in PZT elements 20a, 20b than the method of providing PZT elements 20a, 20b along smooth surfaces 21a, 21b of smooth beam spring 22 shown in FIG. 1. The present inventors found that this slotted composite configuration works well to provide substantially more strain, and substantially more electrical power from PZT elements 20a, 20b than cantilever beam spring 22 that is not slotted. Because slotted beam 22t' is still tapered, a uniform distribution of strain from one end of beam 22t' to the other continues to be expected.

Typically a metal such as steel, aluminum, beryllium copper, titanium, or superelastic nickel titanium has been used to provide the good spring properties needed for cantilever beam spring 22 because such metals can vibrate with very little loss to friction. However, until the present patent application, most such metals have had much more stiffness than PZT elements 22 bonded to their surfaces. So when PZT elements 20a, 20b were bonded to metal cantilever beam spring 22t and when applied a load, such as proof mass 24, was applied, most of this load was supported by the metal of cantilever beam spring 22t and less was supported by compression and expansion of PZT elements 20a, 20b.

Tapered slotted metal beam spring 22t' retains the full thickness $H_{PZ}$, from the point of view of PZT elements 20a, 20b. Composite structure 34t' of FIG. 5 retains the stiffness contributed by PZT elements 20a, 20b but reduces the stiffness contributed by beam spring 22t' because of slots 40. Thus, the present inventors provided composite structure 34t' in which the overall stiffness was dominated by the stiffness of PZT elements 20a, 20b rather than by the stiffness of underlying beam spring 22t'. This composite structure 34t' also retained the low loss to friction provided by a smooth beam without slots. Most of the resistance to bending was provided by PZT elements 20a, 20b, and hence PZT elements 20a, 20b experienced more strain and generated more energy and more electricity for harvesting than smooth beam counterparts.

One alternative is to provide PZT elements 20a, 20b on a beam spring fabricated of a more flexible material than a metal, such as a foam, which is much less rigid than metal, so virtually all of the resistance to bending would be provided by PZT elements 20a, 20b while very little would be provided by the foam beam spring, even if the foam was not slotted. Other materials, such as rubber, wood, or a polymer such as polyethylene can also be used. But such materials dissipate more energy to friction than metal does when it vibrates, and so some of the energy of vibration that otherwise could be converted into electrical energy may be lost. In addition foam may not be strong enough to withstand the shear forces introduced by repeated bending during vibration at large amplitude.

Thus, a cantilever beam spring that has low losses to friction, that provides wide separation between PZT elements, that is highly flexible, and that can withstand the shear forces of the vibration, is desired. The present inventors found that slots 40 in aluminum cantilever beam spring 22t' did not add to the friction losses and that the resulting beam spring 22t' retained its low dissipation and high Q factor while retaining resistance to shearing forces, and generated substantially more electricity than a standard aluminum cantilever beam spring.

Figure 6:
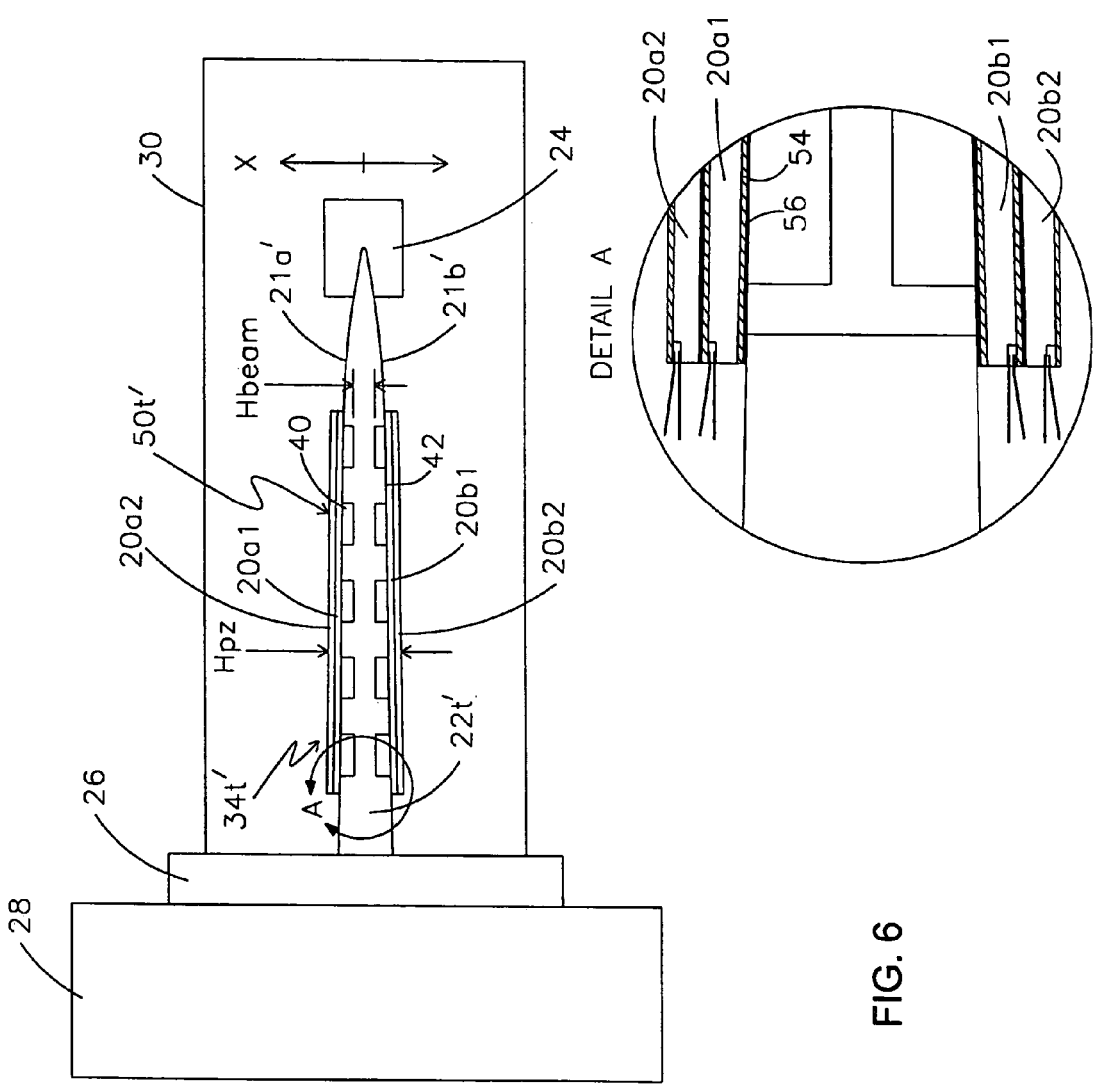
FIG. 6 and DETAIL A are cross sectional views of an embodiment of a cantilever beam spring similar to that of FIG. 5 in which slots are provided in a tapered beam spring having a proof mass, and a double layer of piezoelectric elements are bonded to remaining surfaces on either side of the slots.

PZT elements 20a1, 20a2, 20b1, 20b2 can be stacked as shown in FIG. 6 and in DETAIL A to increase the amount of electricity generated without enlarging slotted beam 22t'. Insulative layer 54 is used between PZT elements 20a1 and 20a2 to prevent shorting. Thin epoxy adhesive layer 56 is used to bond PZT elements 20a1 and 20a2 to beam 22t' and to each other.

Figure 7:
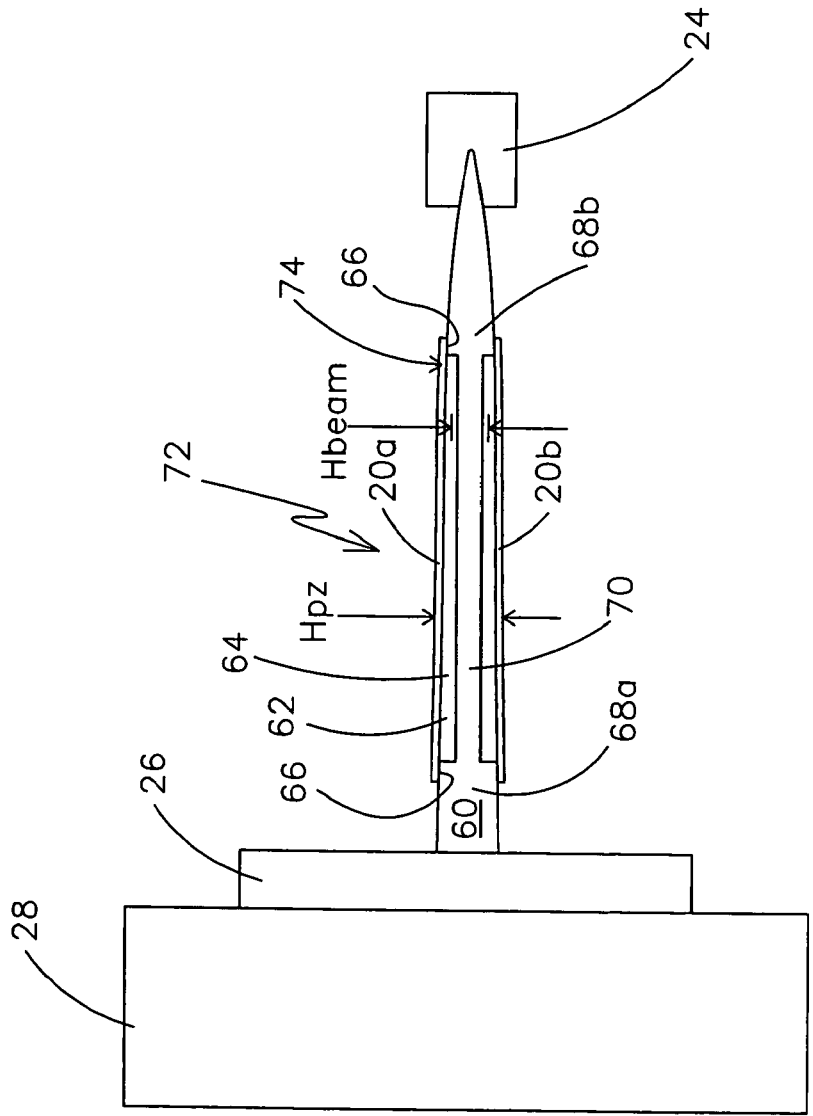
FIG. 7 is a cross sectional view of another tapered embodiment of a cantilever beam spring of the present patent application in which a large slot is provided in the beam spring which is filled with a material such as foam and piezoelectric elements are bonded to the material and to remaining surfaces on either side of the slot.

The present applicants have also designed another embodiment of a spring that provides the advantages of foam while retaining the strength of a metal beam, as shown in FIG. 7. In this embodiment, beam spring 60 includes large slots 62. Low stiffness material 64, such as foam pieces, are adhesively bonded within large slots 62. PZT elements 20a, 20b are then epoxied both to ridges 66 across large slots 62 and to foam pieces 64 bonded within large slots 62. During vibration of beam spring 60 thick areas of 68a, 68b of aluminum beam spring 60 on either side of large slots 62 and web 70 between large slots 62 withstand the shear load, retaining durability compared to a purely foam beam. Nevertheless beam spring 60 acts as if it was almost as thin as web 70 extending between large slots 62. And beam spring 60 retains most of the low friction of a smooth beam. Beam spring 60 therefore acts mechanically as if it is a thin beam with much less stiffness than it would have if large slots 62 were not machined. Stiffness of composite beam 72 is dominated by stiffness of PZT spring 74 that includes PZT elements 20a, 20b. Because narrow slots need not be machined for this embodiment, the cost for fabricating it may be lower than for slotted beam 22t' of FIG. 5.

In addition to foam, low stiffness material 64 can be a material, such as rubber, wood, or a polymer, such as polyethylene or silicone. Low stiffness material 64 is bonded in slots 62 and fills in to provide a surface to which PZT elements 20a, 20b can be bonded so PZT elements 20a, 20b won't buckle. Material 64 preferably has sufficient strength to hold PZT elements 20a, 20b so they bend with beam spring 60 but do not buckle.

When beam 60 bends, PZT elements 20a, 20b undergo tension and compression, and the stress they experience is very high. In comparison to that stress, the force needed to prevent PZT elements 20a, 20b from buckling is very low. Low stiffness material 64 can have a stiffness adequate to prevent buckling while having a stiffness that is about one or two orders of magnitude lower than that of beam material 60. Thus, low stiffness material 64 can have a stiffness that is high enough to prevent PZT from buckling while being low enough so it does not contribute to the bending stiffness of beam spring 60.

Low stiffness material 64 damascened into large slot 62 adds damping, lowering the Q of vibrating beam 22. For harvesting energy from vibration a low loss, high Q system is preferable. So having many slots with enough ridges to avoid buckling may be preferable to adding a lossy material within the slots. In consideration of the load from bending, the space D across slots 40 or the separation between ridges 66, and the thickness of PZT elements 20a, 20b, one can determine whether a filler material in slots 40, 62 is desirable as compared to the potential losses to damping.

Tapered slotted beam 22t' has base region 80, tapered region 82, and bar region 84, as shown in FIGS. 8a-8d. Base region 80 is for connection to base 26 which is attached to vibrating structure 28 (see FIG. 5). Energy from vibrating structure 28 sets proof mass 24 on tapered beam 22t' vibrating so that energy can be harvested with PZT elements 20a, 20b which vibrate with tapered beam 22t' (see FIG. 5). Tapered region 82 includes slots 40 and ridges 42. Bar region 84 has scribe lines 86 that allow ready positioning of proof mass 24 mounted thereon.

In an experiment, tapered slotted beam 22t' was fabricated of aluminum and had a total length of 3.438 inches and a width of 0.674 inches. Base region 80 was about 0.9 inches long and had a maximum height of 0.2 inches. In this embodiment, bar region 84 was about 1.463 inches long, had the same width of 0.674 inches, and had the same height of 0.2 inches.

Tapered region 82 tapered from a 0.2 inch height that extended 0.5 inches from the left end down to a height of 0.090 inches adjacent bar region 84. Tapered region 82 includes slotted portion 88 having eight slots 40 located in this 0.687 inch long portion. In the present experiment the taper was linear at 3 degrees, the length of the slotted portion was 0.687 inches and PZT elements 20a, 20b extended 1 inch in the length direction and extended beyond slotted portion 88 on either side by about 0.16 inches.

Slots 40 had a spacing D that was 0.05 inches across and were separated by metal ridges 42 that had a dimension R that was 0.041 inches across. Remaining metal S vertically left between slots 40 was 0.03 inches high. Tapered region 82 extended past slotted portion 88 for another 0.76 inches until it reached bar region 84 at rounded corners 90 having a radius of 0.063 inches. In the present experiment, eight slots were provided with a pitch of 0.091 inches. Beam 22t' was made more flexible while providing multiple points of restraint to the PZT elements 20a, 20b by making spacing D across each slot 40 small compared to overall length L of PZT elements 20a, 20b (see FIG. 5) as they extended across slots 40 toward proof mass 24 to make tapered composite beam 34t'.

Bonding PZT elements 20a, 20b to each ridge 42 prevented buckling of PZT elements 20a, 20b so they maintained desired separation distance and so they acted against each other, one in tensile stress, the other in compressive stress. Bonding PZT elements 20a, 20b to each metal ridge 42 between slots 40 held each PZT element 20a, 20b in place at that desired spacing. Leaving a significant area of material on ridges 42 for bonding to PZT elements 20a, 20b provides strong intermittent support to PZT elements 20a, 20b to maintain the desired separation distance between two PZT elements 20a, 20b and to maintain the taper shape provided by beam 22t'. The constraints provided by these solidly bonded multiple points of attachment also restricted or prevented other modes of vibration.

A larger number of thinner slots provides more points of attachment for PZT elements 20a, 20b so points of attachment are close enough together for each PZT element spanning each slot 40 to avoid buckling when that PZT element 20a, 20b goes into compression.

Bar region 84 is for holding proof mass 24, is about 1.4 inches long, and has scribe lines 86 that are about 0.015 inches deep for facilitating positioning of proof mass 24. Proof mass 24 had a mass of about 250 grams and was connected along bar region 80 with a screw (not shown).

Variations on all these dimensions are possible. For example, a greater width W increases the surface area on both sides of tapered beam 22t' which increases the area of PZT element 20a, 20b that can be used which increases the energy that can be harvested, as also shown by the equations above. With a wider flex beam a larger proof mass 24 may be used to retain the same mass per unit width to achieve the same natural frequency of vibration. Variation in the mass or its position will change the resonant frequency of the energy harvesting composite system.

A thicker beam and deeper slots provide a greater spacing between PZT elements 20a, 20b while not substantially changing height H of beam 22t', and this may also increase the energy harvested with slotted beam 22t'.

Within limits imposed by the taper, a greater length of slotted region 88 of beam 22t' increases the area of PZT elements 20a, 20b extending over slotted region 88, increasing the energy that can be harvested.

Various numbers of slots and various dimensions for each slot can be used. The present inventors expected improved results with a larger number of narrower slots that are closer together and set the slot dimensions in the experiment determined by the ability to machine narrowest possible slots 40 and narrowest possible ridges 42.

In the experiment, Macrofiber composite piezoelectric elements 20a, 20b, part number M 2814 p2 obtained from Smart Material GmbH, Dresden, Germany, was bonded to each side of slotted portion 88 of tapered region 82 with epoxy connecting each PZT element 20a, 20b to each ridge 42 along tapered region 82, as shown in FIG. 5 and in FIGS. 8a-8c.

In one embodiment, PZT elements 20a, 20b are provided spanning slotted portion 88 on slotted beam 22t' widely separated from neutral axis 32. Beam 22t' was fabricated of aluminum, a material that has good spring properties so it loses little energy to friction and can vibrate for a long time. Slots provided on both sides of beam 22t' removed about half the material of beam 22t' in the slotted region so beam 22t' had a reduced effective thickness in this region. Beam 22t' had sufficient slots that, although its outer surfaces remained widely separated, it acted mechanically as if it was a narrow beam with low stiffness, providing a large amplitude of vibration for a given initial lateral force and therefore provided a large strain to PZT elements 20a, 20b so they could generate more electricity.

Of course, elements 20a, 20b need not both be PZT material. For example an element replacing element 20b can be a layer of some other material that provides stiffness on that side of the composite beam to counter movement of PZT element 20 to enable PZT element 20 to generate electricity even though the opposed element replacing element 20b is not generating electricity. Two opposed PZT elements 20a, 20b generate twice as much electricity as one would, however.

In the embodiment shown in FIG. 5, proof mass 24 had its center of mass C located along the intersection of the extension of top and bottom tapered surfaces 21a', 21b' of cantilever beam spring 22t' to provide a uniform strain field in PZT elements 20a, 20b bonded to slotted tapered surfaces 21a', 21b'.

Proof mass 24 can be manually moved within a range of positions along bar region 84 of flex beam 22t' to change the natural frequency of the resonant structure to provide tuning so beam 22t' and proof mass 24 combine to provide a natural frequency of vibration that matches the vibration frequency of vibrating structure 28 on which beam 22t' is mounted. The present inventors recognized that for many applications, such as machines and ships that operate for long periods of time at a specified motor speed, and provide a vibration frequency that does not change much with time, setting up proof mass 24 manually once to provide the beam with a natural frequency matching that relatively constant vibration frequency was sufficient.

Figure 9:
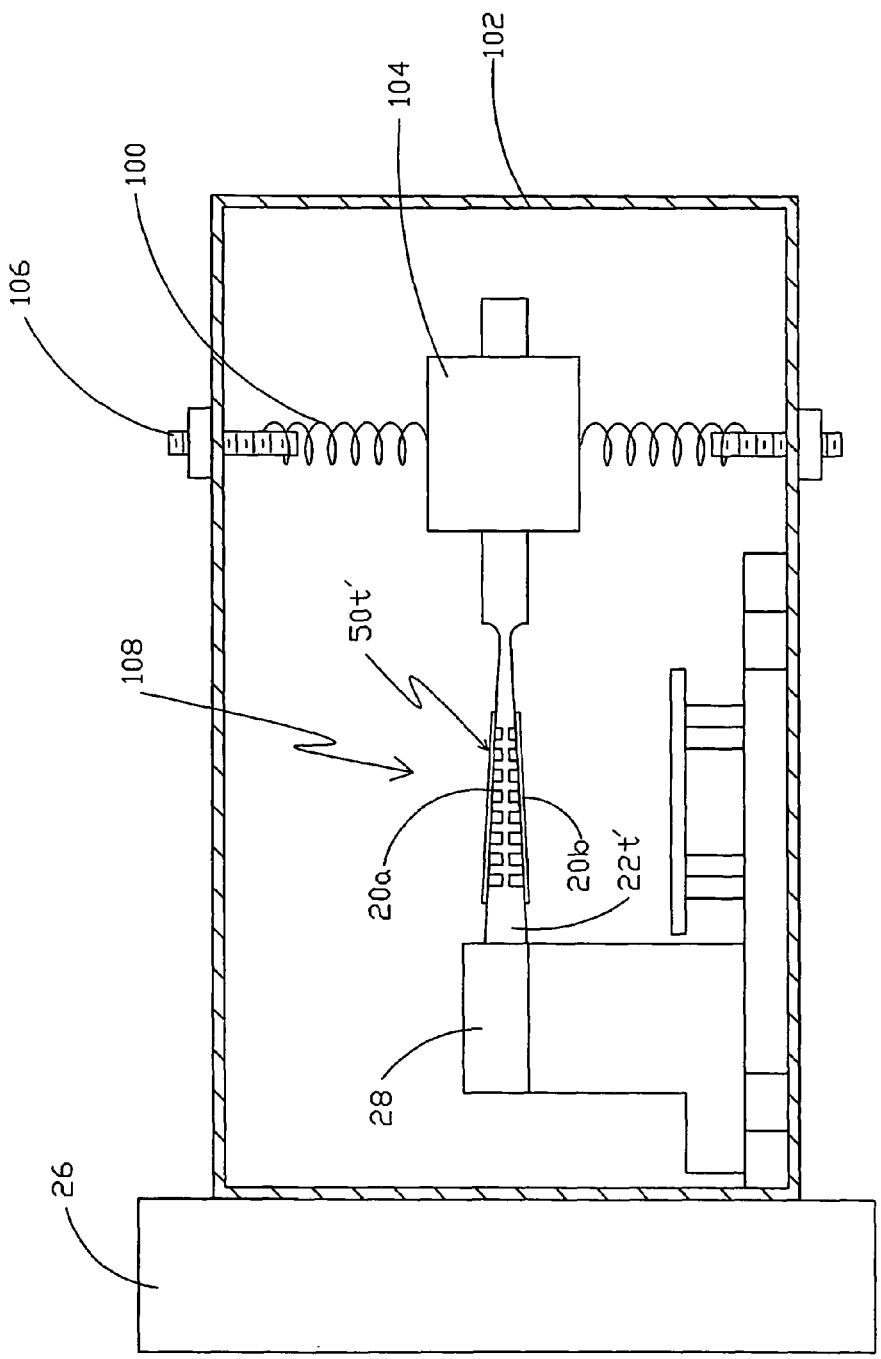
FIG. 9 is a cross sectional view of a tapered embodiment of a cantilever beam spring of the present patent application in which slots are provided in the beam spring and piezoelectric elements are bonded to remaining surfaces on either side of the slots and in which the resonant frequency of the cantilever beam and the proof mass can be tuned by adjusting compression of springs.

Other schemes for manually tuning can alternatively be provided. One such scheme involves providing spring 100 within enclosure 102 connected to proof mass 104, as shown in FIG. 9. With adjustment screw 106 to manually vary compression of spring 100, and thus adjust its spring constant, the overall natural frequency of composite beam 108, that includes slotted tapered beam 22t', PZT spring 50t', proof mass 104, and spring 100, can be adjusted to match that of vibrating structure 28 on which enclosure 102 is mounted. More than one spring 100 can be provided.

Figure 10A:
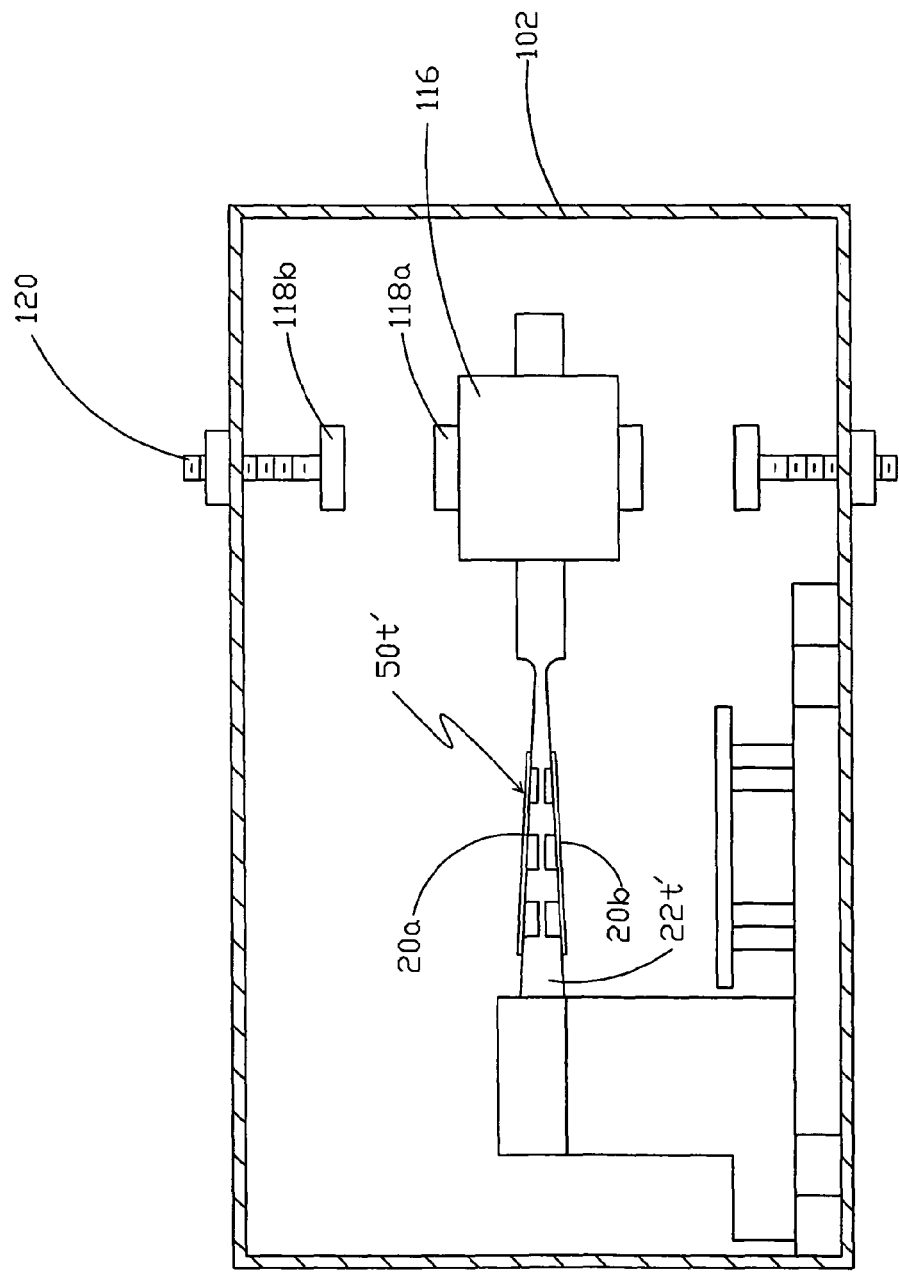
FIGS. 10a and 10b are a cross sectional views of a tapered embodiment of a cantilever beam spring of the present patent application in which slots are provided in the beam spring and piezoelectric elements are bonded to remaining surfaces on either side of the slots and in which the resonant frequency of the cantilever beam and the proof mass can be tuned by adjusting location of magnets.
Figure 10B:
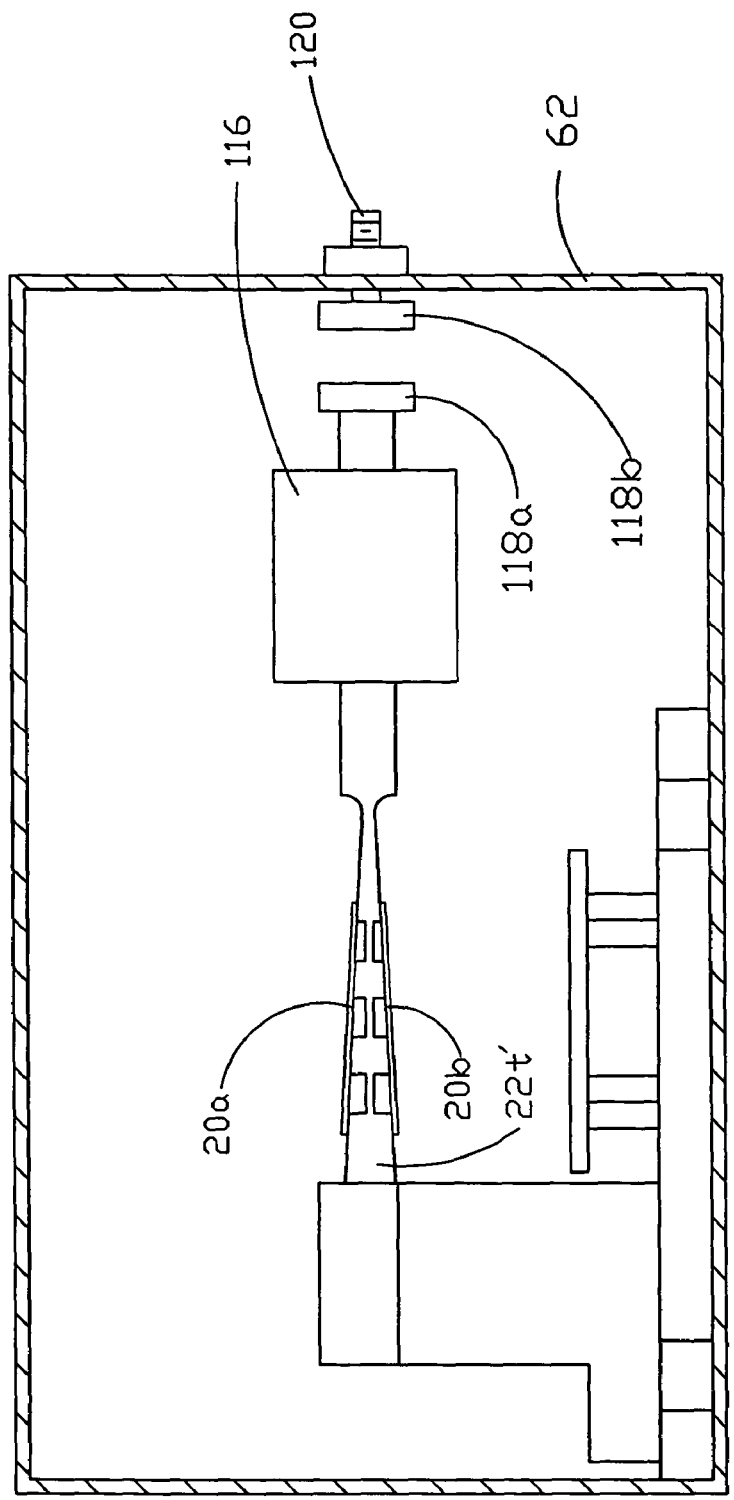

Another scheme for manually tuning involves providing proof mass 116 that includes permanent magnet 118a within housing 102, as shown in FIGS. 10a, 10b. Magnet 118b is mounted on manual adjustment screws 120 so its position can be varied. As the position of magnet 118b is varied with adjustment screw 120 the magnetic field strength experienced by magnet 118a on proof mass 116 varies and so does natural frequency of mass 116, thus providing tuning. A motor drive and a controller connected to adjustment screws 80 would permit automatic adjusting natural frequency of vibration.

In addition to providing tuning, a magnet adds a non linear element to composite spring 50t' that is useful to prevent an overload condition. For example if slotted flexible beam 22t' vibrates with too large an amplitude, the bending strains may be sufficient to break PZT elements 20a, 20b. Magnets 118a, 118b provide increasing resistance as amplitude increases. Within the normal operating range magnets 118a, 118b, provide additional resistance that can be used to adjust frequency of vibration. As amplitude of vibration increases, magnets 118a, 118b provide a much greater restoring force to prevent an overload condition that could break PZT elements 20a, 20b. Thus, by combining a non-linear element, such as magnets 118a, 118b, with tapered slotted beam 22t', if amplitude exceeds the normal zone then magnets 118a, 118b become the major restraining force and PZT elements 20a, 20b are not overloaded. While magnets 118a, 118b do not change the properties of composite spring 50t', magnets 118a, 118b add an additional restoring force that increases with the displacement.

For a typical slotted tapered beam 22t' with proof mass 24, one can expect to vary the natural frequency by about +/−10%. This tuning range is likely to be sufficient for equipment that operates within such a small range of frequencies, such as helicopters, which operate with constant rotor speed. Increasing range of frequency can be obtained by substituting different slotted tapered beams 22t' with different width, length, or thickness.

Figure 12:
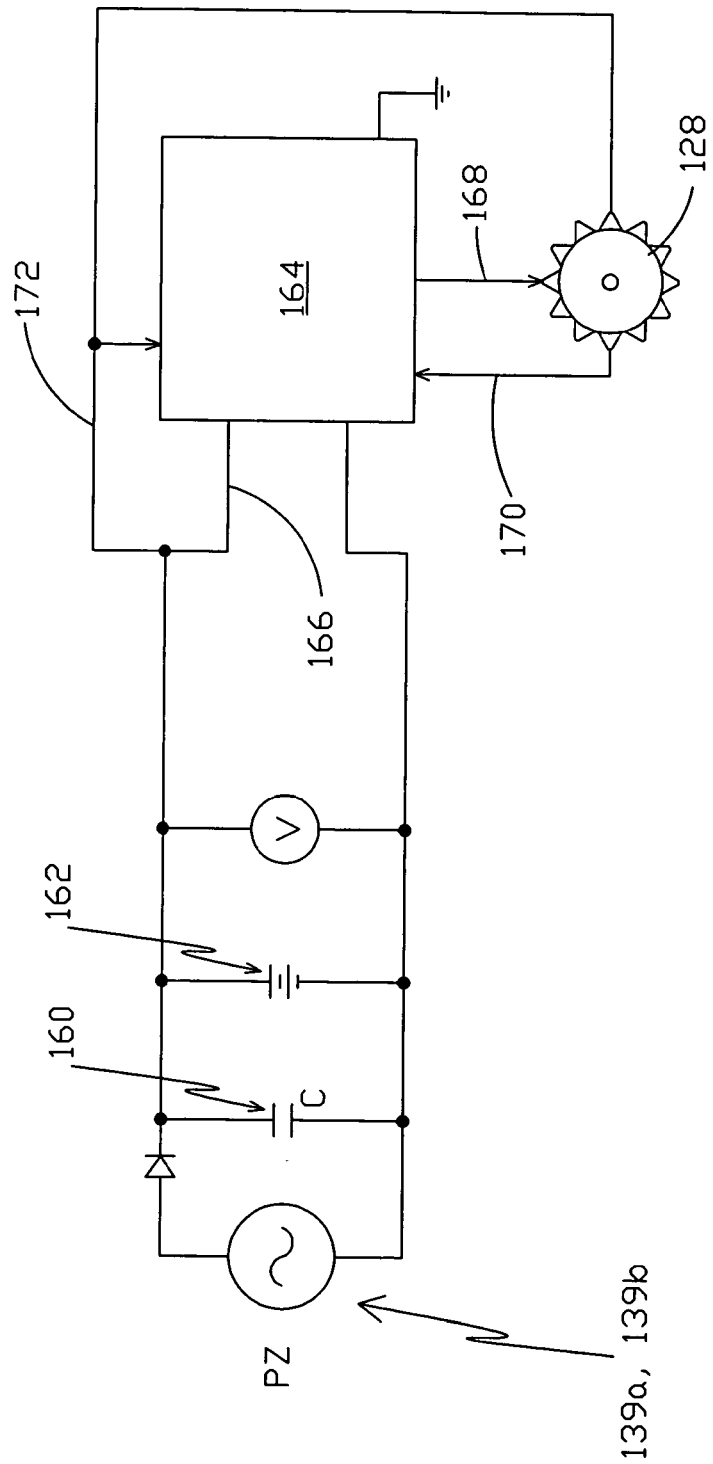
FIG. 12 is a block diagram showing a circuit for using energy harvested by the energy harvesting piezoelectric elements to power the motor of FIGS. 11a and 11b.

Another scheme involves providing motor 128 connected to adjust position of proof mass 130, as shown in FIGS. 11a, 11b and in the block diagram of FIG. 12. Motor 128 drives pinion gear 132 that adjusts position of rack gear 134 connected to shaft 136 that extends through tapered slotted beam 138 with its PZT elements 139a, 139b and extends into mass 130. As shaft 136 is driven to the right by operation of motor 128, mass 130 is forced to the right, compressing spring 140. When shaft 136 is driven to the left by operation of motor 128, tension on mass 130 is reduced and spring 140 drives mass 130 back to the left. Motor 128 may have an integral rotary position encoder (not shown) to provide rotary position feedback.

Motor 128 and pinion gear 132 are supported on mounting block 142. Shaft 136 is supported by shaft supports 144a, 144b. Mass 130 is supported by dovetail groove 146 in bar region 148 of beam 138.

Motor 128 may be operated with energy derived from energy harvesting provided by PZT elements 20a, 20b on beam 138 and stored in capacitor 160 and/or battery 162, as shown in FIG. 12. Once sufficient energy has been harvested and stored, motor 128 may be operated to move mass 130 gradually in one direction. The rate of energy harvesting is monitored in feedback controller 164 which monitors voltage across capacitor 160 along lines 166. If the rate of energy harvesting increases with motion provided by motor 128, feedback controller 164 directs motor 128 to continue to move mass 130 in the same direction until mass 130 is located at a position that maximizes the rate energy is harvested. For example, feedback controller 164 can determine a position at which the rate of change of energy with changing position goes to zero. Feedback controller provides direction to motor 128 along line 168 and keeps track of parameters, such as position of mass 130, through encoder line 170.

If the rate of energy harvesting decreases with motion provided by motor 128, feedback controller 164 sends a signal to motor 128 along line 168 to reverse direction so mass 130 moves oppositely until the position is found that maximizes the rate energy is harvested. Feedback controller 164 can be a dsPic30F6010, available from Microchip Technologies, Inc., Chandler, Ariz.

Energy needed to operate motor 128 to move proof mass 130, and to operate feedback controller 164, provided along line 172, may offset the energy needed to move mass 130. For a machine whose frequency is slowly changing the amount of additional energy generated by tuning to that frequency may make adding automatic control desirable.

Recognizing that vibration may be directional, the present inventors also found that orienting beam 22t' in an orientation which provides the highest vibration levels to the system will improve the rate energy may be harvested. However, for many applications, such as machines and vehicles, the preferred orientation does not change much with time so determining the preferred orientation and setting up the flexing beam once in the preferred orientation was sufficient.

In another embodiment, bulk piezoelectric elements 180, such as single crystal piezoelectrics, are provided in slots 40" of slotted beam 22t" as shown in FIGS. 13a-13d. Flex material 182 with electrical contacts 184a, 184b folds into slots 40". Wiring 186a, 186b connects to contacts 184a, 184b on the portion of flex material 182 that bends 90 degrees from slots 40" and extends along edge 188 of slotted beam 22t". Flex material may be thin polyimide with conductive traces and insulative layers built in.

In fabricating slotted beam 22t" bulk piezoelectric elements 180 can be cooled sufficiently and/or slotted beam 22t" can be heated sufficiently that bulk piezoelectric elements 180 fit into slots 40". Upon return to room temperature, a residual compressive stress is thereby provided to bulk piezoelectric elements 180. Alternatively, slotted beam 22t" can be stretched in a pair of clamps which also opens slots 40" to receive bulk piezoelectric elements 180. When the clamps are released a residual compressive stress is thereby provided to bulk piezoelectric elements 180. In another alternative, slotted beam 22t" may be subjected to bending, which will open slots 40" on one side of slotted beam 22t" to receive snuggly fitting bulk piezoelectric elements 180. Then an opposite bending load may be applied to receive snuggly fitting bulk piezoelectric elements 180 on the opposite side of slotted beam 22t". Adhesive can be provided on flex material 182 or within slot 40" to prevent the bulk piezoelectric elements from falling out. Adhesive located within slot 40" should be compliant to prevent stiffening of slotted beam 22t".

Bulk piezoelectric elements should exhibit a high coupling coefficient ($k_{33}$) along their thickness so that alternating strains generated with vibration of slotted beam 22t" will be efficiently converted into electrical energy. Single crystal piezoelectric material may be obtained from commercial sources for this embodiment, and these single crystal piezoelectric materials provide high coupling coefficients. One commercial source for single crystal piezoelectric material is part number PMN-PT-28 from Morgan Electro Ceramics, Bedford, Ohio. These bulk piezoelectric materials exhibit high coupling coefficient ($k_{33}$=0.86–0.90), as compared to conventional bulk piezoelectric materials, such as PZT-4 ($k_{33}$=0.70) or PZT-5H ($k_{33}$=0.75).

Figure 14A:
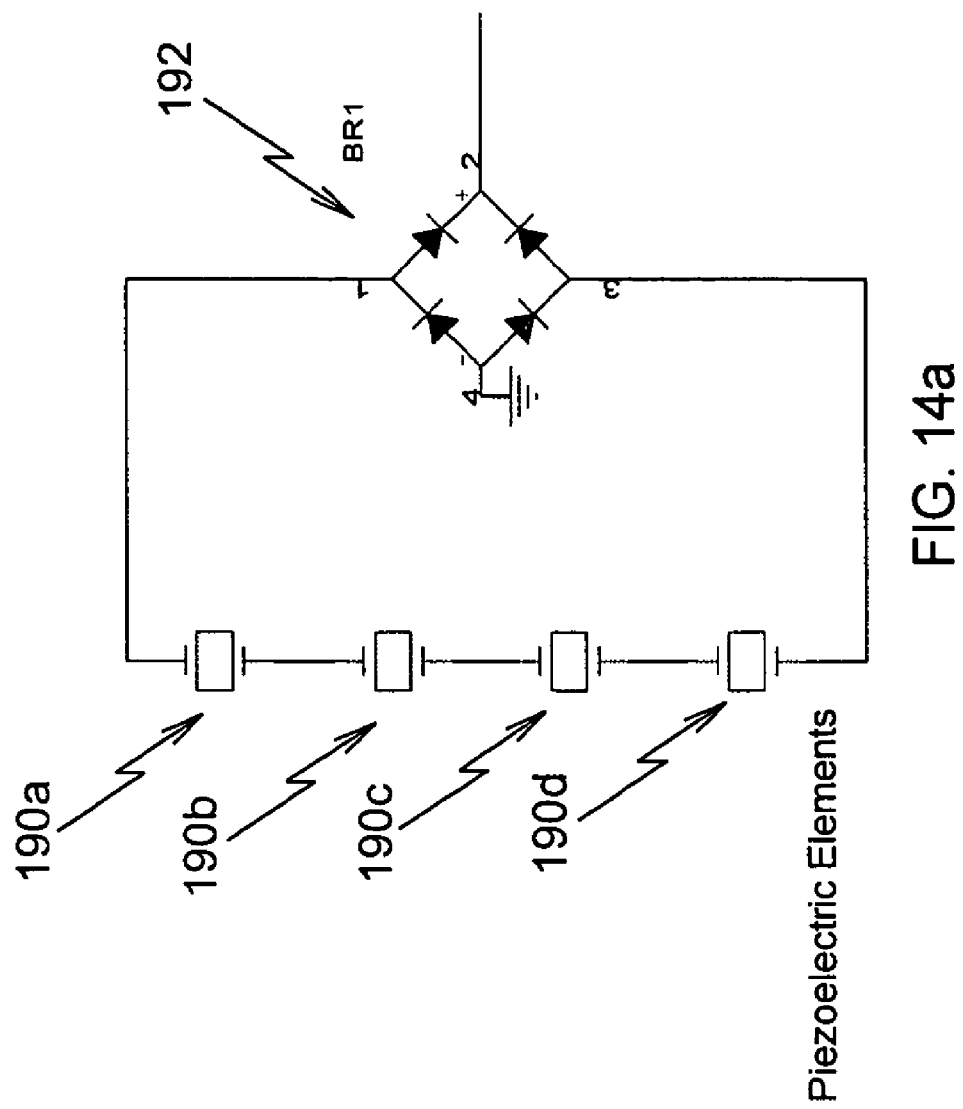
FIG. 14a is a block diagram showing how PZT elements, such as stacked PZT elements, can be arranged in series with each other and with a diode rectification bridge.
Figure 14B:
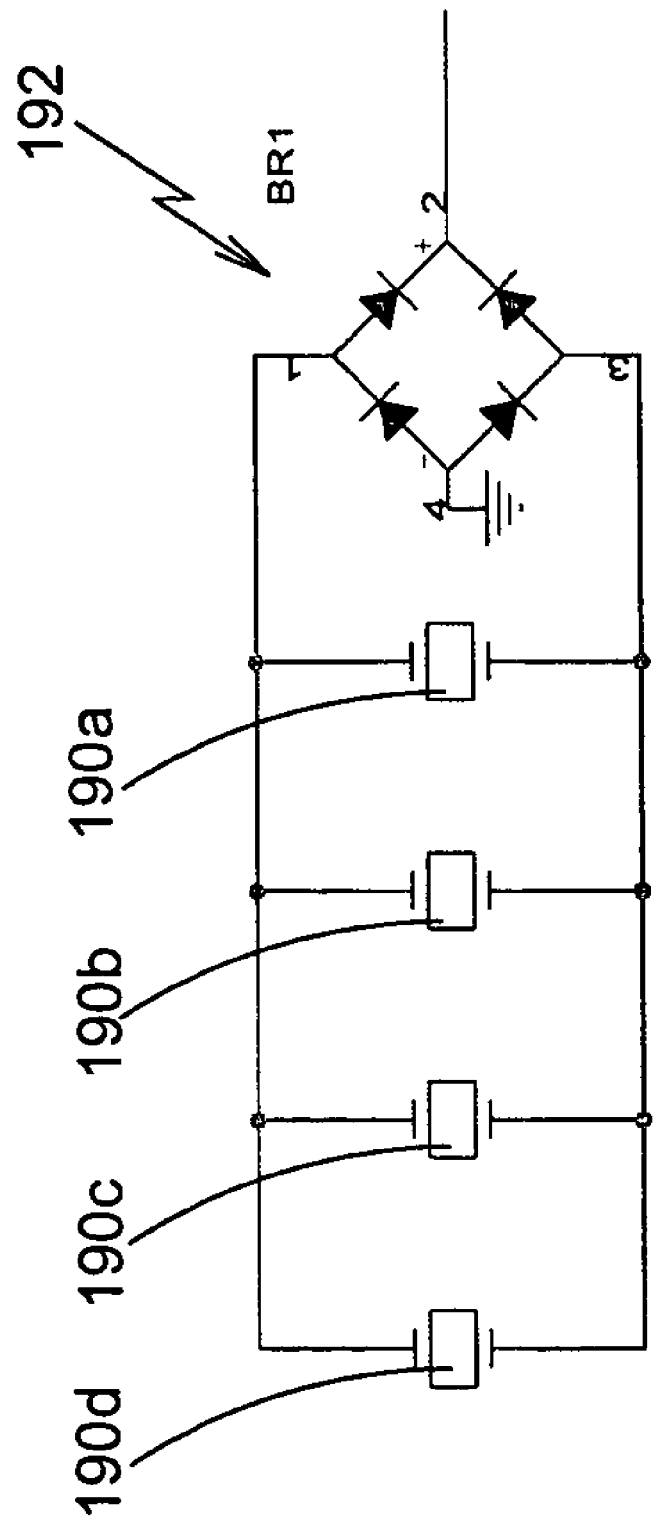
FIG. 14b is a block diagram showing how PZT elements, such as stacked PZT elements, can be arranged in parallel with each other and with a diode rectification bridge.
Figure 14C:
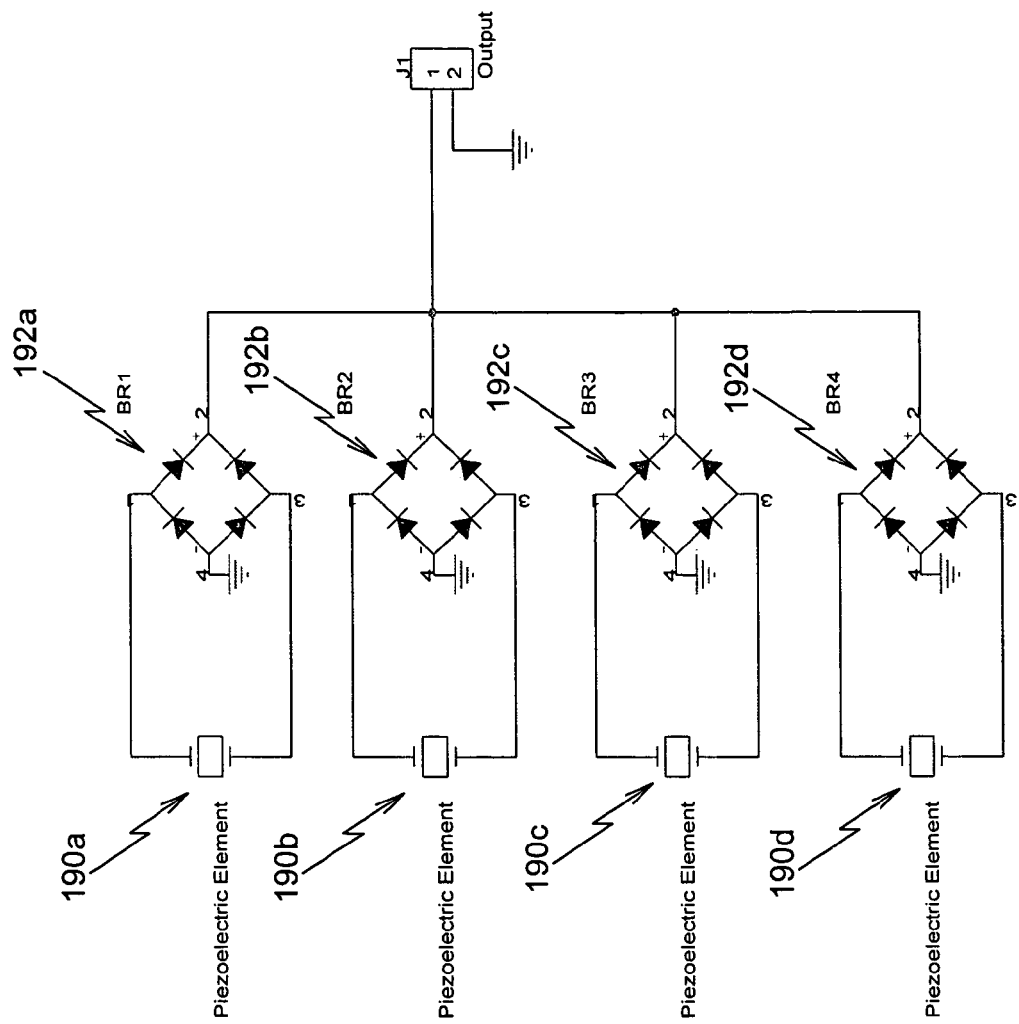
FIG. 14c is a block diagram showing an arrangement of PZT elements, such as stacked PZT elements, each connected to its own diode rectification bridge.

Multiple PZT elements 190a-190d, such as stacked PZT elements 20a1, 20a2, 20b1, 20b2, as shown in FIG. 6 or such as bulk piezoelectric elements 180, as shown in FIG. 13d, may be connected to single diode bridge 192 in series, as shown in FIG. 14a, or in parallel, as shown in FIG. 14b. In another connection scheme, separate diode rectification bridge 192a-192d is used for each PZT element 190a-190d, as shown in FIG. 14c. In this embodiment each PZT element is independently rectified so that if strains are not equal among PZT elements energy is not lost from the highly strained elements into the lesser strained elements. Furthermore, should a lead wire break from any one of the PZT elements energy will still be provided at the output.

Figure 14D:
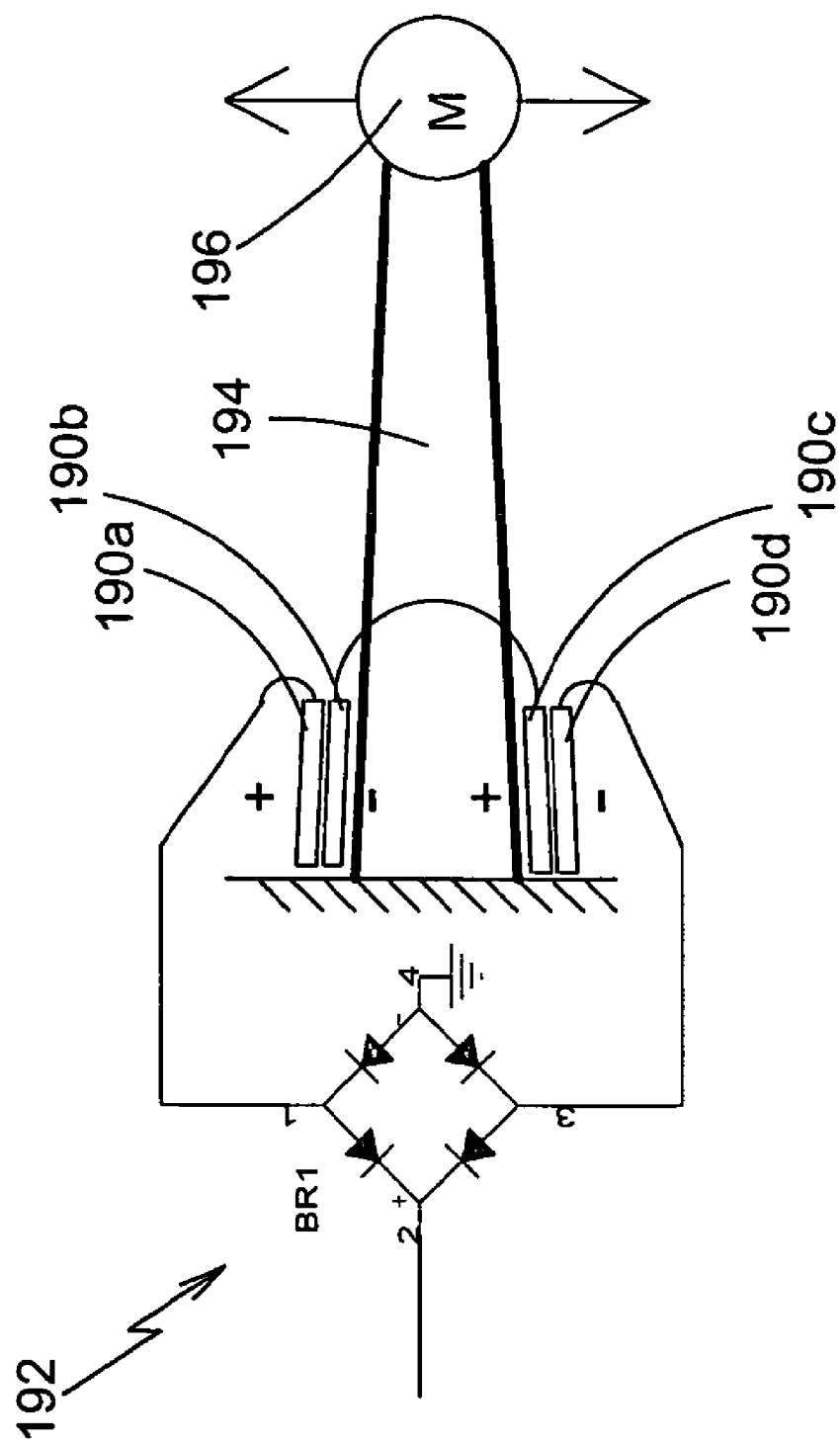

One mechanical embodiment of the series circuit of FIG. 14a, with stacked PZT elements 190a-190d mounted on beam 194 with proof mass 196 and connected to single diode bridge 192, is shown in FIG. 14d.

While the disclosed methods and systems have been shown and described in connection with illustrated embodiments, various changes may be made therein without departing from the spirit and scope of the invention as defined in the appended claims.

The invention claimed is:

1. An energy harvesting system, comprising a composite structure including a first spring, a piezoelectric structure, a proof mass, a natural frequency adjustment device, and a controller, wherein said piezoelectric structure and said proof mass are mounted on said first spring, wherein said composite structure has a composite structure natural frequency of vibration, wherein said controller is connected to automatically adjust said natural frequency adjustment device to adjust said composite structure natural frequency.

2. An energy harvesting system as recited in claim 1, further comprising a substrate, wherein said composite structure is mounted on said substrate, wherein said substrate has a substrate vibration frequency, wherein said controller automatically adjusts said composite structure natural frequency to tune said composite structure to have a composite structure natural frequency about equal to said substrate vibration frequency.

3. An energy harvesting system as recited in claim 2, wherein position of said proof mass on said first spring is automatically adjustable to provide said composite structure with a composite structure natural frequency that is about equal to said substrate vibration frequency.

4. An energy harvesting system as recited in claim 2, wherein a feedback signal from said piezoelectric element is used by said controller to automatically adjust said composite structure natural frequency.

5. An energy harvesting system as recited in claim 4, wherein said controller automatically adjusts said composite structure natural frequency to about equal said substrate vibration frequency.

6. An energy harvesting system as recited in claim 4, wherein said controller automatically adjusts position of said mass on said first spring to provide said composite structure with a composite structure natural frequency about equal to said substrate vibration frequency.

7. An energy harvesting system as recited in claim 1, further comprising a second element coupled to said first spring, wherein varying a parameter of said second element varies said composite structure natural frequency.

8. An energy harvesting system as recited in claim 7, wherein said second element includes a second spring.

9. An energy harvesting system as recited in claim 7, wherein said second element includes a magnet.

10. An energy harvesting system as recited in claim 1, wherein said first spring includes a taper.

11. An energy harvesting system as recited in claim 1, wherein said first spring has a first spring surface having elevated portions separated by a recessed portion, wherein said piezoelectric structure substantially crosses said recessed portion, wherein said recessed portion provides that effective thickness of said first spring is substantially less than thickness of said first spring would be without said recessed portion.

12. An energy harvesting system as recited in claim 11, wherein said piezoelectric structure includes a piezoelectric element bonded to said elevated portions.

13. An energy harvesting system as recited in claim 12, wherein said first spring surface has a plurality of said recessed portions, wherein an elevated portion is located on both sides of each said recessed portion.

14. An energy harvesting system as recited in claim 13, wherein said piezoelectric element extends across each of said recessed portions and is bonded to each of said elevated portions.

15. An energy harvesting system as recited in claim 14, wherein said first spring includes a taper.

16. An energy harvesting system as recited in claim 14, wherein said first spring has a lower stiffness than said piezoelectric element.

17. An energy harvesting system as recited in claim 13, wherein said first spring includes a long axis, wherein said recessed portions are arranged perpendicular to said long axis.

18. An energy harvesting system as recited in claim 11, wherein a low stiffness material is located within said recessed portion, wherein said piezoelectric element is bonded to said low stiffness material.

19. An energy harvesting system as recited in claim 11, wherein said first spring has a structure that provides a damping characteristic about equal to that of a first spring without said recessed portion.

20. An energy harvesting system as recited in claim 11, wherein said piezoelectric structure includes a second piezoelectric element located in said recessed portion.

21. An energy harvesting system as recited in claim 20, wherein said second piezoelectric element includes a bulk piezoelectric material.

22. An energy harvesting system as recited in claim 21, wherein said bulk piezoelectric material includes a single crystal piezoelectric material.

23. An energy harvesting system as recited in claim 21, wherein said first spring surface has an elevated portion defining a level, wherein a portion of said bulk piezoelectric material is located at said level.

24. An energy harvesting system as recited in claim 20, further comprising a flex circuit having wiring, wherein said piezoelectric structure contacts said wiring within said recessed portion.

25. An energy harvesting system as recited in claim 24, wherein said flex circuit extends along an edge of said first spring.

26. An energy harvesting system as recited in claim 1, wherein said composite structure includes a plurality of said piezoelectric elements.

27. An energy harvesting system as recited in claim 26, wherein said first spring has a first side and a second side, wherein a first of said piezoelectric elements is located on said first side of said first spring and a second of said piezoelectric elements is located on said second side of said first spring.

28. An energy harvesting system as recited in claim 27, wherein two said first piezoelectric elements are located on said first side of said first spring and two said second piezoelectric elements are located on said second side of said first spring.

29. An energy harvesting system as recited in claim 28, wherein said two first piezoelectric elements located on said first side of said first spring are stacked and wherein said two second piezoelectric elements located on said second side of said first spring are stacked.

30. An energy harvesting system as recited in claim 26, wherein said plurality of piezoelectric elements are stacked.

31. An energy harvesting system as recited in claim 26, further comprising a plurality of rectifier bridges, wherein each of said plurality of piezoelectric elements is connected to a different one of said rectifier bridges.

32. An energy harvesting system as recited in claim 1, wherein said first spring is fabricated of metal.

33. An energy harvesting system as recited in claim 32, wherein said metal includes a superelestic nickel titanium material.

34. An energy harvesting system as recited in claim 5, wherein said first spring has a first spring surface having elevated portions separated by a recessed portion, wherein said piezoelectric structure substantially crosses said recessed portion, wherein said substrate frequency is variable.

35. An energy harvesting system as recited in claim 34, wherein said first spring includes a taper.

36. An energy harvesting system as recited in claim 34, wherein said piezoelectric structure includes a piezoelectric element bonded to said elevated portions.

37. An energy harvesting system as recited in claim 34, wherein said first spring surface has a plurality of said recessed portions, wherein an elevated portion is located on both sides of each said recessed portion.

38. An energy harvesting system as recited in claim 37, wherein said piezoelectric element extends across each of said recessed portions and is bonded to each of said elevated portions.

39. An energy harvesting system as recited in claim 34, wherein said first spring has a lower stiffness than said piezoelectric element.

40. An energy harvesting system as recited in claim 34, wherein said composite structure includes a plurality of said piezoelectric elements.

41. An energy harvesting system as recited in claim 40, wherein said plurality of piezoelectric elements are stacked.

42. An energy harvesting system as recited in claim 40, further comprising a plurality of rectifier bridges, wherein each piezoelectric element of said plurality of piezoelectric elements is connected to a different one of said rectifier bridges.

43. An energy harvesting system as recited in claim 34, wherein said controller automatically adjusts position of said mass on said first spring to provide said composite structure with a composite structure natural frequency that is about equal to said substrate vibration frequency.

44. An energy harvesting system as recited in claim 34, wherein said composite structure further includes a second element coupled to said first spring, wherein varying a parameter of said second element varies said composite structure natural frequency, wherein said controller automatically adjusts said parameter.

45. An energy harvesting system as recited in claim 44, wherein said second element includes a second spring.

46. An energy harvesting system as recited in claim 44, wherein said second element includes a magnet.

* * * * *